(12) United States Patent
Witcraft et al.

(10) Patent No.: US 7,423,329 B2
(45) Date of Patent: Sep. 9, 2008

(54) SEMICONDUCTOR DEVICE AND MAGNETO-RESISTIVE SENSOR INTEGRATION

(75) Inventors: William F. Witcraft, Minneapolis, MN (US); Lonny L. Berg, Elk River, MN (US); Mark D. Amundson, Cambridge, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/742,335

(22) Filed: Apr. 30, 2007

(65) Prior Publication Data
US 2007/0200565 A1 Aug. 30, 2007

Related U.S. Application Data

(62) Division of application No. 10/754,946, filed on Jan. 8, 2004, now Pat. No. 7,239,000.

(51) Int. Cl.
*H01L 29/82* (2006.01)
*H01L 43/00* (2006.01)
(52) U.S. Cl. .................. 257/425; 257/424; 257/428
(58) Field of Classification Search ......... 257/421–430; 324/127
See application file for complete search history.

(56) References Cited

U.S. PATENT DOCUMENTS

| | | | |
|---|---|---|---|
| 4,847,584 A | 7/1989 | Pant | 338/32 R |
| 5,247,278 A | 9/1993 | Pant et al. | 338/32 R |
| 5,502,325 A | 3/1996 | Sokolich et al. | 257/421 |
| 5,521,501 A | 5/1996 | Dettmann et al. | 324/252 |
| 5,820,924 A | 10/1998 | Witcraft et al. | 427/130 |
| 5,940,319 A | 8/1999 | Durlam et al. | 365/171 |

(Continued)

FOREIGN PATENT DOCUMENTS

DE 34 26 785 A1 1/1986

(Continued)

OTHER PUBLICATIONS

Geppert, Linda,. "The New Indelible Memories: It's A Three-Way Race In the Multibillion-Dollar Memory Sweepstakes," IEEE Spectrum, Mar. 2003.

(Continued)

*Primary Examiner*—Cuong Q Nguyen
(74) *Attorney, Agent, or Firm*—Black Lowe & Graham PLLC

(57) ABSTRACT

A magnetic-sensing apparatus and method of making and using thereof is provided. The sensing apparatus may be fabricated from semiconductor circuitry and a magneto-resistive sensor. A dielectric may be disposed between the semiconductor circuitry and the magneto-resistive sensor. In one embodiment, the semiconductor circuitry and magneto-resistive sensor are formed into a single package or, alternatively, monolithically formed into a single chip. In another embodiment, some of the semiconductor circuitry may be monolithically formed on a first chip with the magneto-resistive sensor, while other portions of the semiconductor circuitry may be formed on a second chip. As such, the first and second chips may be placed in close proximity and electrically connected together or alternatively have no intentional electrical interaction. Exemplary semiconductor devices that might be implemented include, without limitation, capacitors, inductors, operational amplifiers, set/reset circuitry for the MR sensors, accelerometers, pressure sensors, position sensing circuitry, compassing circuitry, etc.

14 Claims, 7 Drawing Sheets

U.S. PATENT DOCUMENTS

| | | | |
|---|---|---|---|
| 6,054,780 A | 4/2000 | Haigh et al. | 307/91 |
| 6,219,273 B1 | 4/2001 | Katti et al. | 365/158 |
| 6,252,390 B1 | 6/2001 | Black, Jr. et al. | 324/127 |
| 6,331,924 B1 | 12/2001 | Takada | 360/323 |
| 6,461,914 B1 | 10/2002 | Roberts et al. | 438/253 |
| 6,462,983 B2 | 10/2002 | Katti et al. | 365/171 |
| 6,998,688 B2 * | 2/2006 | De Jongh et al. | 257/414 |
| 7,277,793 B2 * | 10/2007 | Witcraft et al. | 701/207 |
| 2002/0021580 A1 | 2/2002 | Katti et al. | 365/158 |
| 2002/0153551 A1 | 10/2002 | Wong et al. | 257/303 |
| 2003/0016011 A1 | 1/2003 | Witcraft et al. | 324/252 |
| 2003/0042900 A1 | 3/2003 | Witcraft et al. | 324/252 |
| 2003/0042901 A1 | 3/2003 | Witcraft et al. | 324/252 |
| 2003/0091846 A1 | 5/2003 | Kobayashi et al. | 428/493 |
| 2004/0019272 A1 | 1/2004 | Witcraft | 600/410 |

FOREIGN PATENT DOCUMENTS

| | | |
|---|---|---|
| EP | 0656666 | 6/1995 |
| EP | 1221715 | 7/2002 |
| EP | 1302778 | 4/2003 |
| JP | 08116107 | 5/1996 |

OTHER PUBLICATIONS

"Magnetic Sensor Products HMC/HMR Series," Honeywell International Inc., Oct. 1996.

"Honeywell Magnetic Sensors Product Catalog," Honeywell International Inc., May 2003.

"1-and 2-Axis Magnetic Sensors HMC1001/1002 : HMC1021/1022," Honeywell International Inc., Apr. 2000.

"Magnetic Sensors, Frequently Asked Questions" printed from the World Wide Web at http://www.ssec.honeywell/magnetic/faq.htm on May 6, 2003.

* cited by examiner

SEMICONDUCTOR DEVICE AND MAGNETO-RESISTIVE SENSOR INTEGRATION

RELATED APPLICATIONS

This application is a divisional application of U.S. application Ser. No. 10/754,946.

U.S. application Ser. No. 10/754,946 claims the benefit of U.S. Provisional Application Nos. (1) 60/475,191, filed Jun. 2, 2003, entitled "Semiconductor Device Integration with a Magneto-Resistive Sensor," naming as inventors Lonny L. Berg and William F. Witcraft; (2) 60/475,175, filed Jun. 2, 2003, entitled "On-Die Set/Reset Driver for a Magneto-Resistive Sensor," naming as inventors Mark D. Amundson and William F. Witcraft; (2) 60/475,191; and (3) 60/462,872, filed Apr. 15, 2003, entitled "Integrated GPS Receiver and Magneto-Resistive Sensor Device," naming as inventors William F. Witcraft, Hong Wan, Cheisan J. Yue, and Tamara K. Bratland. The present application also incorporates each of these Provisional Applications in their entirety by reference herein U.S. application Ser. No. 10/754,946 is also related to and incorporates by reference U.S. Nonprovisional application Ser. No. 10/754,945, filed concurrently, entitled "Integrated Set/Reset Driver and Magneto-Resistive Sensor," naming as inventors Lonny L. Berg and William F. Witcraft; and U.S. Nonprovisional Application Ser. No. 10/754,947, filed concurrently, entitled "Integrated GPS Receiver and Magneto-Resistive Sensor Device," naming as inventors William F. Witcraft, Hong Wan, Cheisan J. Yue, and Tamara K. Bratland.

BACKGROUND

1. Field

The present invention relates in general to magnetic field and current sensors, and more particularly, to integrating one or more semiconductor devices with a magnetic field sensor.

2. Related Art

Magnetic field sensors have applications in magnetic compassing, ferrous metal detection, and current sensing. They may detect magnetic field variations in machine components, the earth's magnetic fields, underground minerals, or electrical devices and lines.

In these situations, one may use a magneto-resistive sensor that is able to detect small shifts in magnetic fields. Such magneto-resistive sensors may be formed using typical integrated circuit fabrication techniques. Typically, magneto-resistive sensors use Permalloy, a ferromagnetic alloy containing nickel and iron, as the magneto-resistive material. Often, the Permalloy is arranged in thin strips of Permalloy film.

When a current is run through an individual strip, the magnetization direction of the strip may form an angle with the direction of current flow. As the magnetization direction changes, the effective resistance of the strip changes. Particularly, a magnetization direction parallel to the current flow direction results in maximum resistance through the strip and a magnetization direction perpendicular to the current flow direction results in minimum resistance through the strip. This changed resistance may cause a change in voltage drop across the strip when a current is run through the strip. This change in voltage may be measured as an indication of change in the magnetization direction of external magnetic fields acting on the strip.

To form the magnetic field sensing structure of a magneto-resistive sensor, several Permalloy strips may be electrically connected together. The Permalloy strips may be placed on the substrate of the magneto-resistive sensor as a continuous resistor in a "herringbone" pattern or as a linear strip of magneto-resistive material, with conductors across the strip at an angle of 45 degrees to the long axis of the strip.

This latter configuration is known as "barber-pole biasing." It may force the current in a strip to flow at a 45-degree angle to the long axis of the strip, because of the configuration of the conductors. These sensing structure designs are discussed in U.S. Pat. No. 4,847,584, Jul. 11, 1989, to Bharat B. Pant and assigned to the same assignee as the current application. U.S. Pat. No. 4,847,584 is hereby fully incorporated by reference. Additional patents and patent applications describing magnetic sensor technologies are set forth below, in conjunction with the discussion of FIG. 2.

Magnetic sensors often include a number of straps through which current may be run, for controlling and adjusting the sensing characteristics. For example, magnetic sensor designs often include set, reset, and offset straps. Driver circuitry for these straps has typically been located off-chip, resulting in space inefficiencies.

Similarly, other components, such as operational amplifiers, transistors, capacitors, etc., have typically been implemented on a separate chip from the magnetic sensor. For example, signal conditioning and electrostatic discharge circuitry is typically located off-chip. While this may be fine for some applications, for others, in which physical space is at a premium, it would be desirable to have one or more of these semiconductor components as part of the same chip as the magnetic sensor. Thus a single-chip design would be desirable.

BRIEF DESCRIPTION OF THE DRAWINGS

Preferred embodiments of the present inventions are described with reference to the following drawings, wherein like reference numerals refer to like elements in the various figures, and wherein.

DETAILED DESCRIPTION

In view of the wide variety of embodiments to which the principles of the present invention can be applied, it should be understood that the illustrated embodiments are exemplary only, and should not be taken as limiting the scope of the present invention.

Exemplary Architecture

Figure 1A:
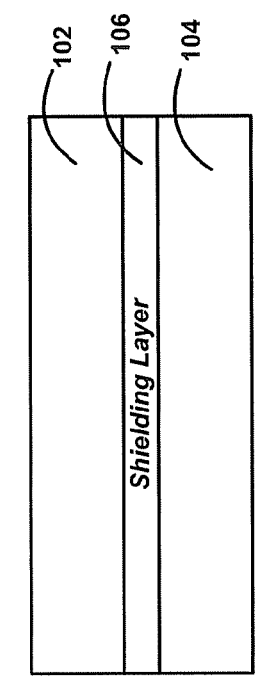
FIGS. 1A-1D are simplified block diagrams illustrating exemplary embodiments.
Figure 1B:
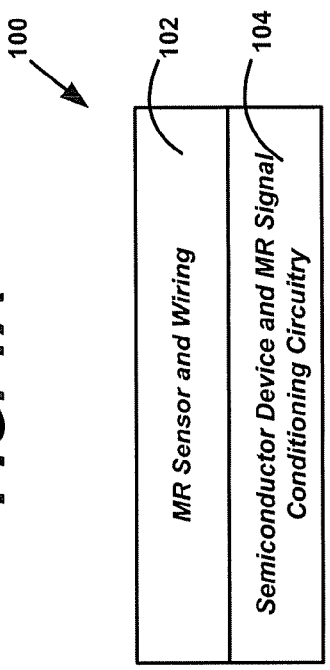

FIGS. 1A-1B are simplified block diagrams illustrating integration of a semiconductor device with one or more magneto-resistive sensing elements. The device 100 includes a first portion 102, including the magneto-resistive sensing elements (hereinafter collectively referred to as an "MR sensor") and wiring (such as thin-film traces), and a second portion 104, including one or more semiconductor device components. In a preferred embodiment, the second portion 104 also includes signal conditioning circuitry and circuitry for ESD (Electro-Static Discharge) protection for the MR sensor in the first portion 102. As discussed below, the second portion 104 is particularly amenable to standard semiconductor fabrication techniques, such as those used for CMOS (Complementary Metal Oxide Semiconductor).

The first and second portions 102, 104 are included within the same chip, so that the device 100 is a discrete, one-chip design. Prior attempts to integrate semiconductor devices with MR sensors have typically involved at least two die, placed separately on a printed circuit board, which likely results in a larger-sized end-user device (e.g. cell phone, portable device, watch, automotive sensor, etc.) and increased complexity. The one-chip design of device 100 provides reduced size and added functionality.

The first and second portions 102, 104 may be manufactured using standard RF/microwave processes, such as CMOS, Bipolar, BiCMOS, GaAs (Gallium Arsenide), and InP (Indium Phosphide), for example. While a technology like GaAs may provide advantages in operational speed, reduced power consumption might best be realized through the use of other techniques, such as those involving SOI (Silicon on Insulator) or MOI (Microwave-On-Insulator), a variation of SOI. In one embodiment, a SOI 0.35μ processing is used.

In a preferred embodiment, the first portion 102 is manufactured using standard lithography, metallization, and etch processes, such as those set forth in the list of patents incorporated by reference below. Other techniques for manufacturing the MR sensor may also be used, however. The second portion 104 is preferably manufactured using the SOI 0.35μ processing, or another RF/microwave method, such as GaAs processing.

Integrating the MR sensor with the one or more semiconductor device components may be accomplished in one of at least two ways. In a first embodiment, the MR sensor can be fabricated on the same die as the semiconductor device components, and may include other circuitry, such as signal conditioning and ESD protection circuitry. In a second embodiment, the MR sensor is fabricated on a first die, while at least some of the semiconductor device components are fabricated on a second die. The first and second die may then be placed in close proximity to one another and may be packaged within a single integrated circuit chip. In either case, it may be advantageous to include one or more connections between the semiconductor device components and the MR sensor depending on the particular application. For example, such connections could provide feedback. Alternatively, the semiconductor device components and MR sensor may be simply physically close to one another, but with no intentional electrical interaction.

Because conventional semiconductor processing techniques may be used, the particular semiconductor device circuitry is not disclosed herein, as it is flexible. Thus, conventional semiconductor designs implementable in CMOS/Bipolar/BiCMOS, can be utilized in accordance with the presently disclosed embodiments. Exemplary semiconductor devices that might be implemented include, without limitation, capacitors, inductors, operational amplifiers, set/reset circuitry for the MR sensors, accelerometers, pressure sensors, position sensing circuitry, compassing circuitry, etc.

Some semiconductor device components may generate electromagnetic fields significant enough to influence operation of the MR sensor. Thus, the sensitive parts of the MR sensor portion 102 of the integrated device 100 may need to be physically separated from parts of the semiconductor device portion 104 in order to provide optimal sensor operation. The amount of separation may be determined using theoretical or empirical means, for example.

Figure 1C:
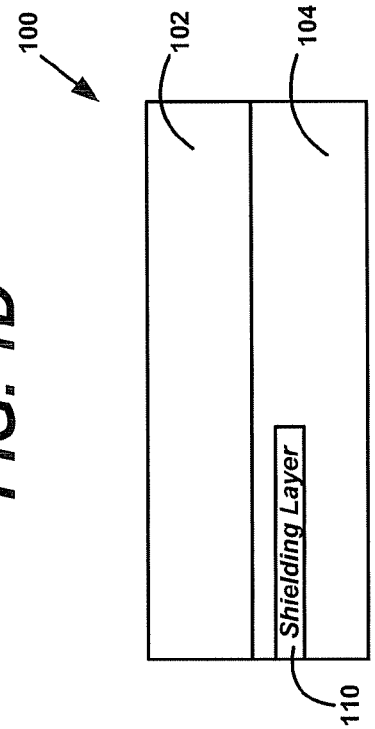
Figure 1D:
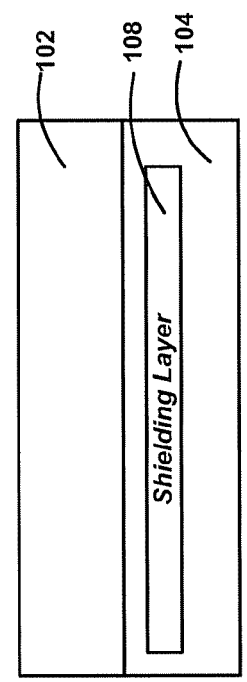

As an alternative to introducing a physical separation between potentially interfering parts of the integrated device 100, a shielding layer may be provided. FIGS. 1B-1D illustrate three exemplary configurations for such a shield. In FIG. 1B, a shielding layer 106 is located substantially between the first portion 102 and the second portion 104. The shielding layer 106 may extend over some or the entire interface between the first and second portions 102, 104, depending on characteristics of the electromagnetic fields and the location of sensitive components. FIG. 1C shows a shielding layer 108 located within the second portion 104. FIG. 1D shows a localized shield 110, which might be beneficial where the majority of the magnetic field effects originate from a relatively small part of the second portion 104. The shield 110, may also be advantageous in designs having electrical connections between the first and second portions 102, 104. Use of a shielding layer or shield will likely allow tighter integration of the device 100 than with physical separation of sensitive parts. While such a shielding layer or shield may comprise metal or magnetic (e.g. NiFe film), other materials may also be suitable.

Exemplary Fabrication Techniques

Figure 2:
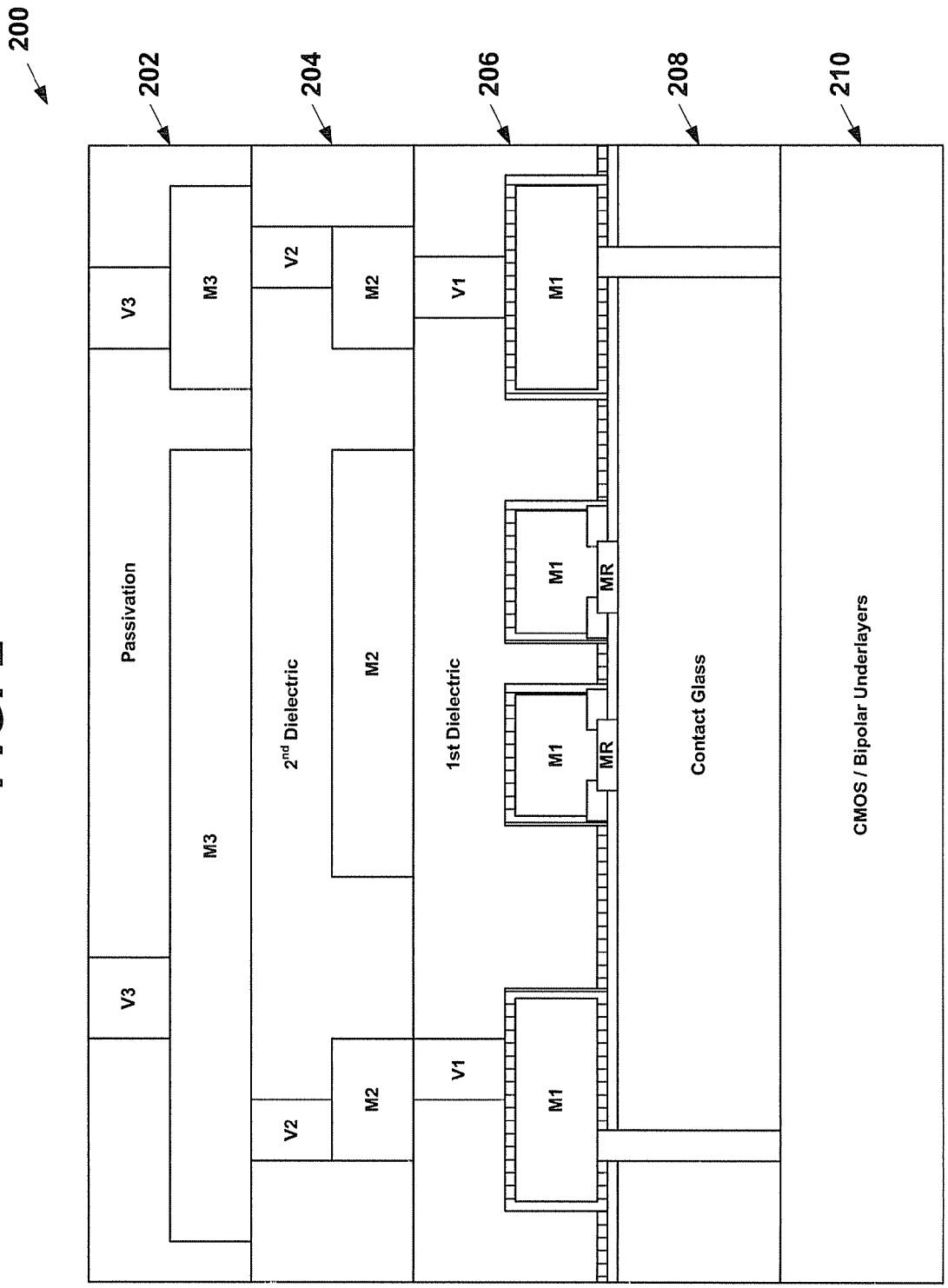
FIG. 2 is a diagram illustrating magneto-resistive sensor having integrated semiconductor underlayers in accordance with an exemplary embodiment.

FIG. 2 illustrates an exemplary cross section of a device 200, in which one or more semiconductor components may be implemented with a MR sensor. For purposes of this example, CMOS/Bipolar semiconductor technologies will be assumed. The semiconductor device components (perhaps along with any signal conditioning circuitry and drivers for set and/or offset straps associated with the MR sensor portion) may be fabricated largely within CMOS/Bipolar underlayers 210, while the MR sensor may be fabricated in the layers 202-206 above the contact glass layer 208. Also shown in FIG. 2 are various contacts V1-V3 and metallizations M1-M3, and NiFe Permalloy structures (see the $1^{st}$ dielectric layer 206).

Besides the underlayers 210, the contact glass layer 208, and the $1^{st}$ dielectric layer, 206, also shown are a second dielectric layer 204, and a passivation layer 202. In one embodiment, layers 202-206 are formed using standard lithography, metallization, and etch processes, while layers 208-210 are formed using the SOI 0.35μ processing, or another RF/microwave method, such as GaAs processing. Other components of the MR sensor (such as set, reset, and offset straps; signal conditioning circuitry, and ESD protection circuitry) may be included in various locations in the layers 206-210, and are not fully illustrated in FIG. 2.

Exemplary Magneto-Resistive Designs

For further information on MR sensor designs, reference may be made to the following Honeywell patents and/or patent applications, all of which are incorporated by reference herein:

U.S. Pat. No. 6,529,114, Bohlinger et al., "Magnetic Field Sensing Device"

U.S. Pat. No. 6,232,776, Pant et al., "Magnetic Field Sensor for Isotropically Sensing an Incident Magnetic Field in a Sensor Plane"

U.S. Pat. No. 5,952,825, Wan, "Magnetic Field Sensing Device Having Integral Coils for Producing Magnetic Fields"

U.S. Pat. No. 5,820,924, Witcraft et al., "Method of Fabricating a Magnetoresistive Sensor"

U.S. Pat. No. 5,247,278, Pant et al., "Magnetic Field Sensing Device"

U.S. patent application Ser. No. 09/947,733, Witcraft et al., "Method and System for Improving the Efficiency of the Set and Offset Straps on a Magnetic Sensor"

U.S. patent application Ser. No. 10/002,454, Wan et al., "360-Degree Rotary Position Sensor"

In addition, U.S. Pat. No. 5,521,501, to Dettmann et al., titled "Magnetic field sensor constructed from a remagnetization line and one magnetoresistive resistor or a plurality of magnetoresistive resistors" is also incorporated herein by reference, and may provide additional details on constructing a MR sensor.

Exemplary Metal-Insulator-Metal Capacitor Integration

Figure 3:
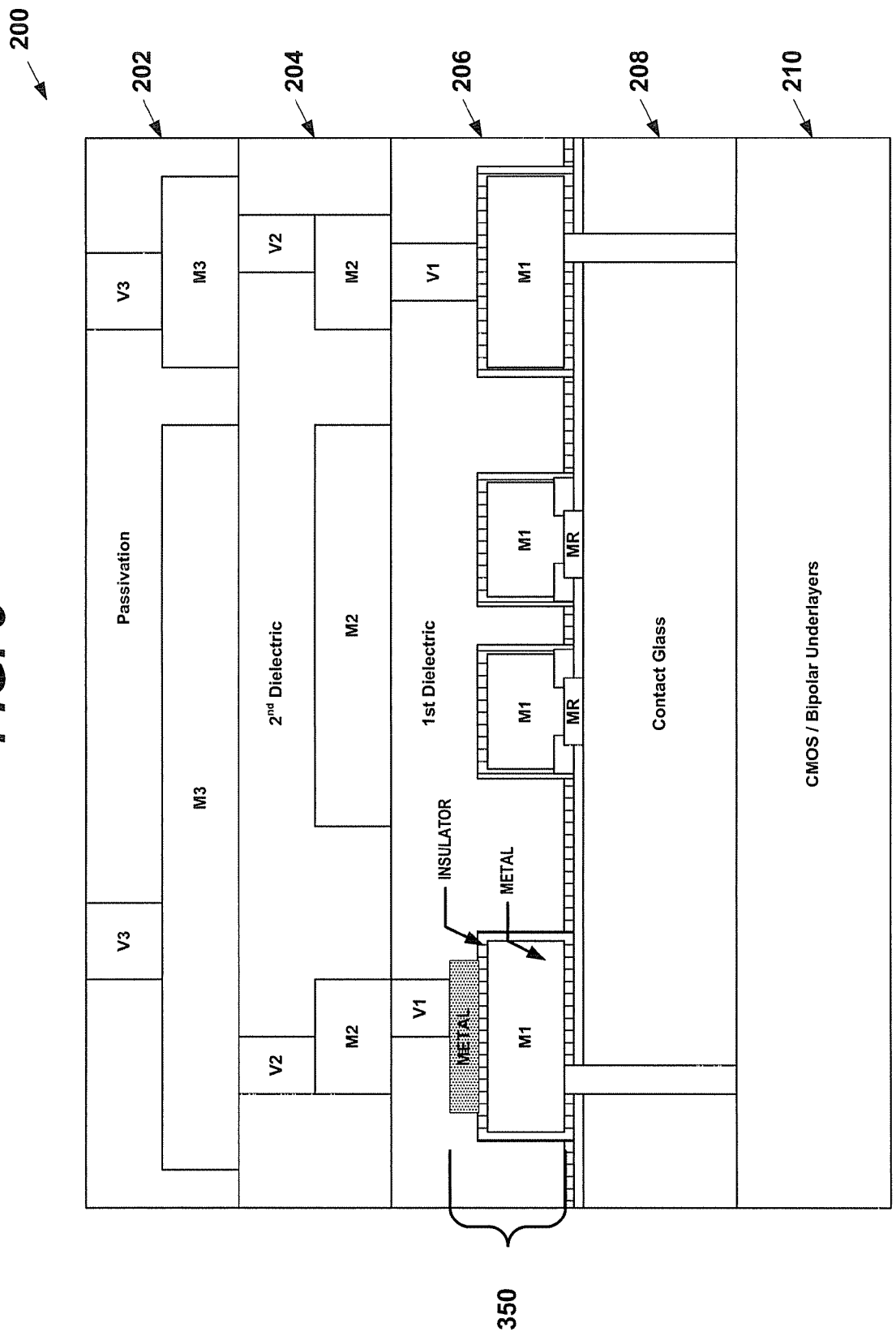
FIG. 3 is a diagram illustrating a magneto-resistive sensor with a MIM capacitor in accordance with an exemplary embodiment.

FIG. 3 illustrates a particular application of integrating a semiconductor device with a MR sensor. The device 200 of FIG. 3 includes many or all of the components illustrated in FIG. 2, with the addition of a Metal-Insulator-Metal (MIM) capacitor 350 shown in the first dielectric layer 206. In addition, the contact V1 adjacent to the MIM capacitor 350 is adjusted accordingly to provide the desired contact points. As shown, the MIM capacitor 350 is located between the contact V1 and a nitride layer overlaying low-resistivity metallization M1. While the MIM capacitor 350 is shown located in the first dielectric layer 206, it could alternatively be in other locations, such as in the passivation layer 202, second dielectric layer 204, or in the CMOS/Bipolar underlayers 210. The integrated MIM capacitor is an improvement over the linear capacitors utilized with prior MR sensors due to its reduced size, possibly resulting in a smaller overall package.

The device 200 is a preferred architecture for a MR sensor, and other architectures, having different Permalloy placements and structures could be used instead. In yet another embodiment, the MIM capacitor 350 could be included in the device 200, and the CMOS/Bipolar underlayers 210 could be omitted or replaced with some other base or substrate material.

Exemplary Semiconductor Circuitry Integration

Figure 4:
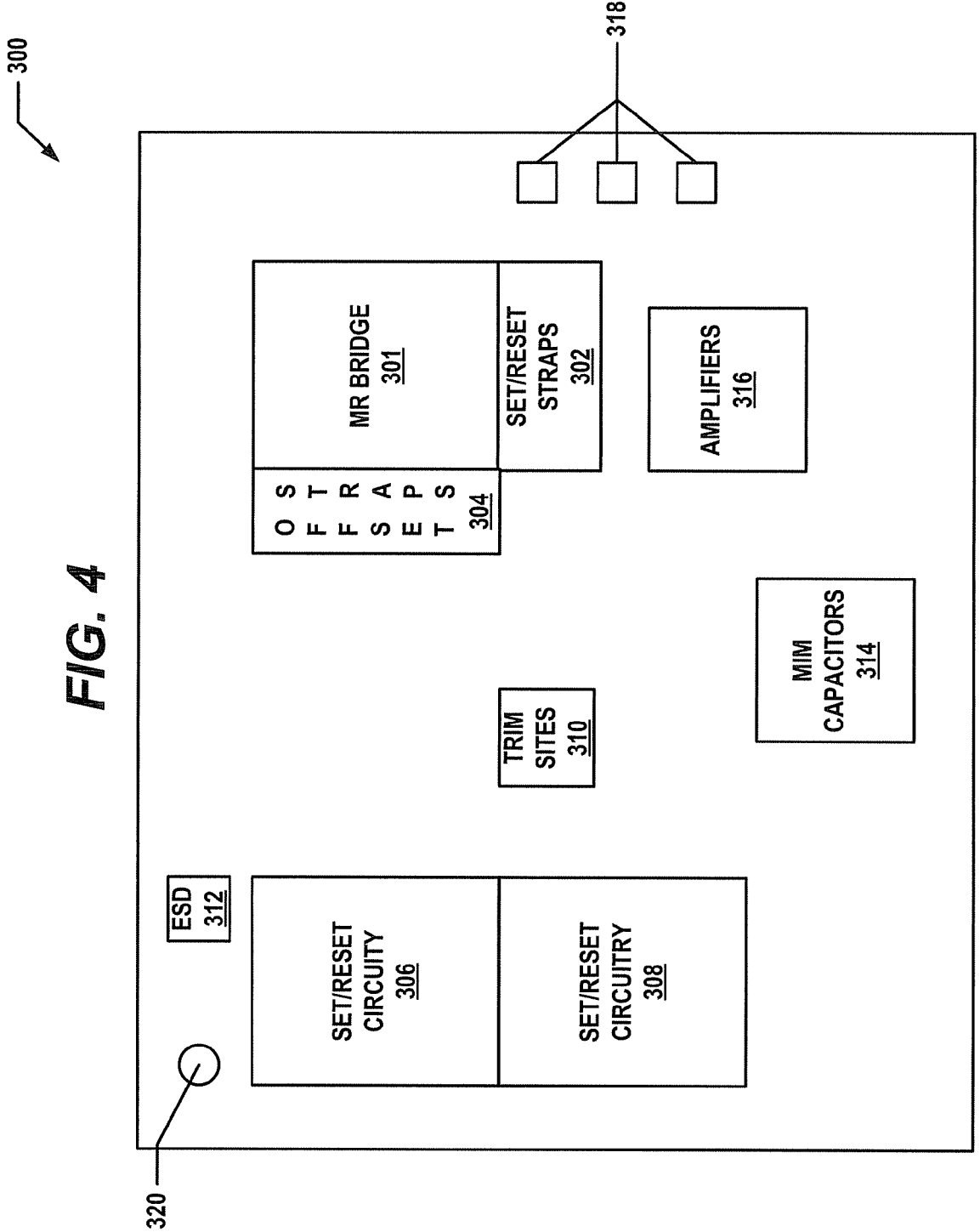
FIG. 4 is a plan view of a magneto-resistive sensor with semiconductor components in accordance with an exemplary embodiment.

FIG. 4 is a plan view of one embodiment of a device 300 in which one or more semiconductor devices are integrated with a MR sensor. The structures visible in FIG. 3 are attributable largely to the MR sensor (and other circuitry, such as set/offset drivers or magnetic sensor signal conditioning circuitry) formed in the underlayers of the device 300. Exemplary parts of the device 300 include a magneto-resistive bridge 301, set/reset straps 302, offset straps 304, set/reset circuitry 306-308, laser trim sites 310 (for matching impedance of the legs of the bridge 301), ESD protection diode 312, MIM capacitors 314, operational amplifiers 316, contacts 318, and test sites 320. Reference may be made to the patents and patent applications incorporated above for further information.

Figure 5:
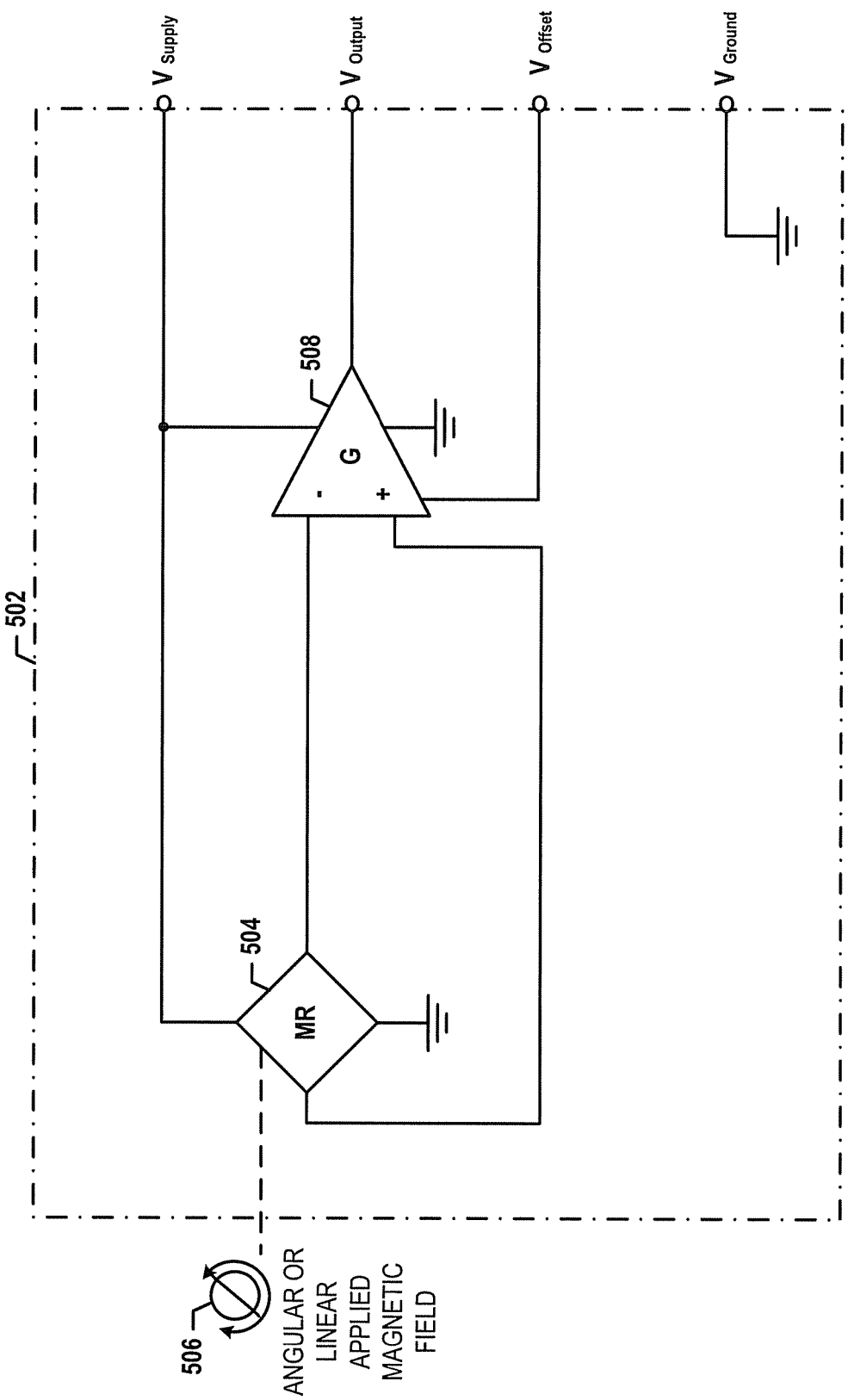
FIG. 5 is a first circuit diagram illustrating an integrated position sensor in accordance with an exemplary embodiment.
Figure 6:
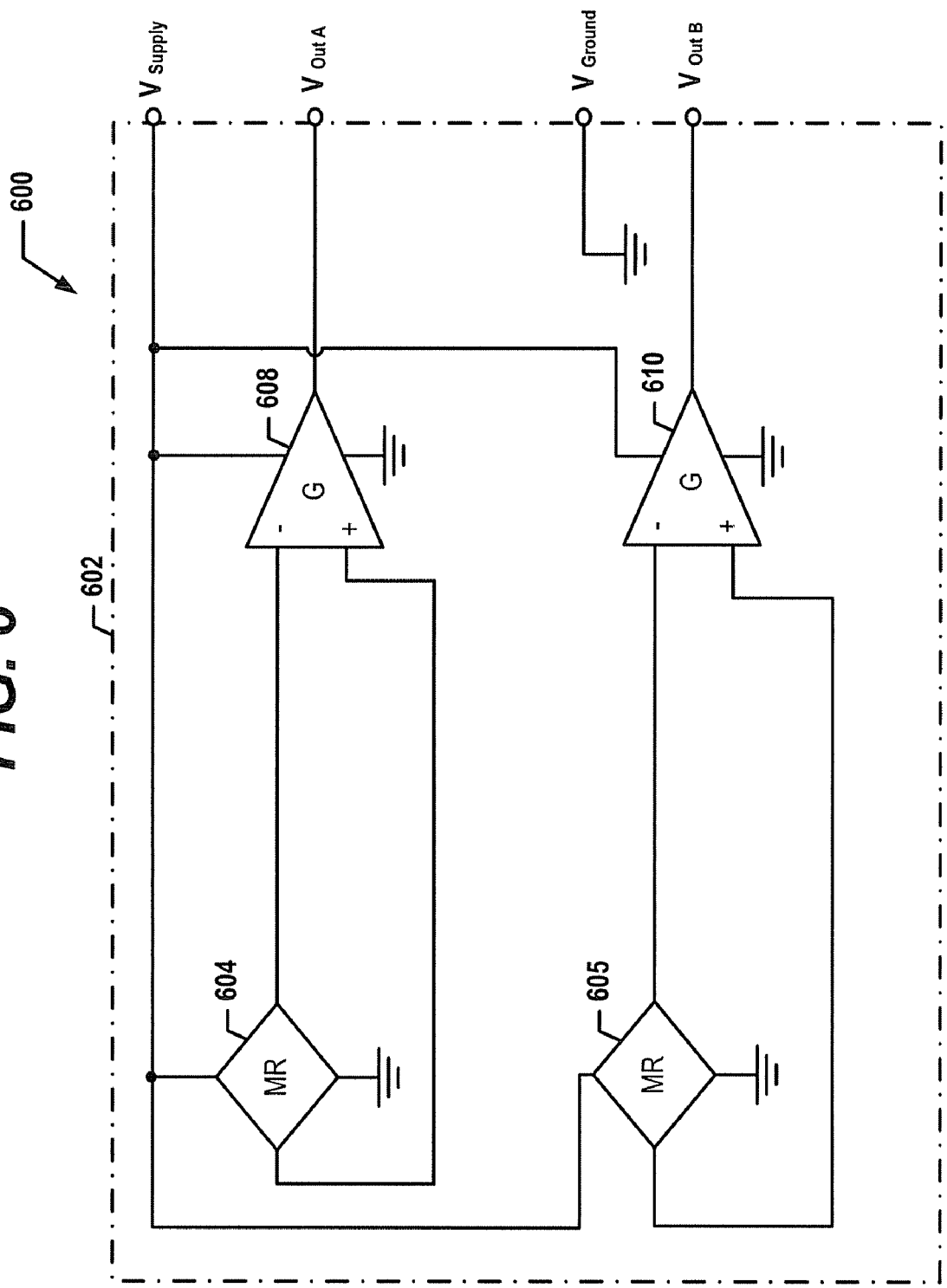
FIG. 6 is a second circuit diagram illustrating a first compassing circuit integrated with a magneto-resistive sensor in accordance with an exemplary embodiment.
Figure 7:
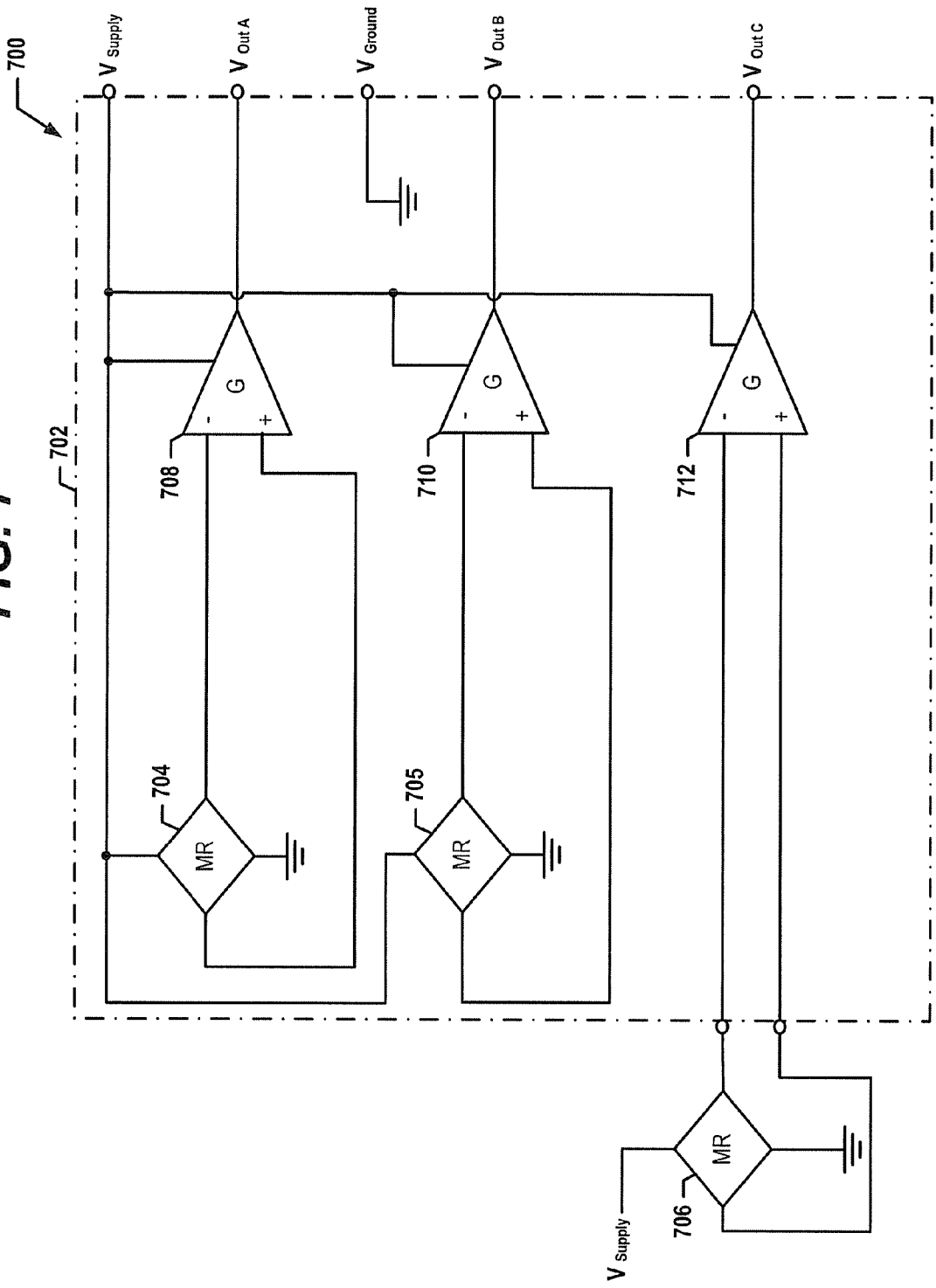
FIG. 7 is a third circuit diagram illustrating a second compassing circuit integrated with a magneto-resistive sensor in accordance with an exemplary embodiment.

FIGS. 5-7 are simplified circuit diagrams illustrating examples of the types of semiconductor circuitry that may be integrated with a MR sensor. These exemplary diagrams are not intended to be an exhausting or inflexible list of circuitry that may be integrated with or integral to the MR sensor, but rather to illustrate the breadth of circuitry that may be so integrated.

FIG. 5 is a simplified circuit diagram 500 illustrating an integrated position sensor. The integrated position senor may be a saturated-mode-type sensor in which position or direction, but not the intensity, of a magnetic field of a device may be detected. The integrated position sensor may employ a position-sensing circuit 502 integrated with a MR sensor 504 along with an externally-placed, bias-magnetic-field generator 506. The bias-magnetic-field generator 506, however, may be placed in close proximity to the integrated position-sensing circuit 502 and MR sensor 504.

The bias-magnetic-field generator 506 may be, for example, a permanent magnetic, an electro-magnetic, an anisotropic or giant magneto-resistive sensor, or other device capable of creating and maintaining magnetic field. In a preferred embodiment, the bias-magnetic-field generator 506 may be a permanent magnetic applying a linear or angular magnetic field greater than about 80 gauss. The magnetic-field generated, however, may be greater than or less than this exemplary value.

The position-sensing circuit 502 may include a difference amplifier 508. The difference amplifier 508 may be deployed with adjustable offset and gain. The adjustable offset and gain may be deployed in the same package as the other circuitry, and in the form of laser trimable components, for instance. Alternatively, the adjustable offset and gain or brought outside the package for use with external controls, such as a simple parallel resistor circuit or more sophisticated regulation and/or trim circuitry. The adjustable offset and gain may be beneficially employed to compensate and/or negate undesirable changes in the MR sensor 504.

The position-sensing circuit 502 may also include temperature compensation circuitry (not shown) to oppose adverse temperature effects of the MR sensor. The temperature-compensation may be, for example, in the form of a thermistor, a Permalloy element, and/or active-regulation circuitry. The active regulation circuitry may sense a change, i.e., a reduction or increase in voltage or current, due to temperature effects and then provide compensation in the form of current and/or voltage in response. The position sensing circuit 502 may include other elements as well.

FIG. 6 is a simplified circuit diagram 600 illustrating a compassing circuit 602 integrated with the MR sensor. In this embodiment, the MR sensor may be formed from first and second magneto-resistive-sensing elements 604, 605 that can sense orthogonal magnetic fields. In a three-dimensional coordinate system, for example, the first magneto-resistive-sensing element 604 may sense magnetic fields in the "X" direction, whereas the second magneto-resistive-sensing element 605 may sense magnetic fields in the "Y" direction. The X-Y planes, of course, may rotate through the coordinate system.

The compassing circuit 602 may include first and second difference amplifiers 608, 610 for the first and second magneto-resistive-sensing elements 604, 605, respectively. Like the position-sensing circuit 502, each of the difference amplifiers 608, 610 may be deployed with adjustable offset and gain to beneficially compensate and/or negate undesirable changes in the magneto-resistive elements 604, 605. The compassing circuit 602 may include temperature compensation circuitry, such as described above, to oppose adverse temperature effects of the MR sensor.

FIG. 7 is a simplified circuit diagram 700 illustrating a second compassing circuit 702 integrated with the MR sensor. In this embodiment, the MR sensor may be formed from first, second and third magneto-resistive-sensing elements 704-706 that can sense three orthogonal magnetic fields. The first and second magneto-resistive sensing elements 704, 705 may be fabricated on a first die, while the third magneto-resistive sensing element 706 may be on a second die. The second die may or may not be packaged with the first and second magneto-resistive sensing elements 704, 705.

In a three-dimensional coordinate system, the first magneto-resistive-sensing element 704 may sense magnetic fields in the "X" direction, whereas the second magneto-resistive-sensing element 705 may sense magnetic fields in the "Y" direction. The third magneto-resistive-sensing element 706 may sense magnetic fields in the "Z" direction. The compassing circuit 702 may include first, second and three difference amplifiers 608-612 for the first, second and third magneto-resistive-sensing elements 704-706, respectively. All three of the difference amplifiers 708-710 may be fabricated on the first die.

Like the position-sensing circuit 502, each of the difference amplifiers 708-712 may be deployed with adjustable offset and gain to beneficially compensate and/or negate undesirable changes in the magneto-resistive elements 704-706. The compassing circuit 702 may include temperature compensation circuitry, such as described above, to oppose adverse temperature effects of the MR sensor.

Exemplary Process for Integrating Semiconductor Components with MR Sensor

Table 1, below, shows a simplified exemplary process for integrating one or more semiconductor device components with a MR sensor. It is believed that such a process is unique because, in the past, semiconductor foundries have gone to great lengths to prevent contamination of their processes with materials typically used in manufacturing magnetic sensors. In addition, companies in the magnetic industries (e.g. disk drive head manufacturers, etc.) have been separate from electronics companies, and their specialized manufacturing techniques have been kept largely separate from one another.

TABLE 1

Sample Manufacturing Process

Clean Wafer
Oxide and Nitride diffusion, lithography, etch,
clean (device-specific structuring)
Boron/Phosphorous implants (if any), clean
(end front-end processing; begin back-end processing)
Deposit contact glass (if any), reflow
Device-specific structuring
Metallizations, deposit and structure
dielectrics (device-specific structuring)
Inspection and evaluation In a preferred embodiment, the semiconductor device processing is done at the front end, while the lithography and etch steps associated with making the MR sensor are done at the back end. Table 1 is intended to be generally applicable to many MR sensor manufacturing processes, and thus does not include detail on how to obtain particular architectures. The architectures shown in FIGS. 2 and 3 would involve several iterations of the backend steps to obtain the multiple layers of dielectrics and metallizations. Of course, additional cleaning and other steps should be implemented as appropriate.

CONCLUSION

Exemplary embodiments of a device using having one or more semiconductor components integrated with a MR sensor device and exemplary processing options have been described. Because such an integrated device may be manufactured as a single chip, the user may realize advantages that include cost reduction, reduced size and increased functionality, among others.

In the foregoing detailed description, numerous specific details are set forth in order to provide a thorough understanding of exemplary embodiments described herein. However, it will be understood that these embodiments may be practiced without the specific details. In other instances, well-known methods, procedures, components and circuits have not been described in detail, so as not to obscure the following description.

Further, the embodiments disclosed are for exemplary purposes only and other embodiments may be employed in lieu of or in combination with of the embodiments disclosed. Moreover, it is contemplated that the above-described apparatus and components may be fabricated using Silicon/Gallium Arsenide (Si/GaAs), Silicon/Germanium (SiGe), and/or Silicon/Carbide (SiC) fabricating techniques in addition to the above-described techniques. Included amongst these techniques are Heterojunction Bipolar Transistor (HBT) fabrication processes, and/or Metal Semiconductor Field Effect Transistor (MESFET) fabrication processes.

The exemplary embodiments described herein may be deployed in various equipment and other devices, which may include or be utilized with any appropriate voltage source, such as a battery, an alternator and the like, providing any appropriate voltage, such as about 0.4, 5, 10, 12, 24 and 48 Volts DC, and about 24, and 120 Volts AC and the like.

Further, the claims should not be read as limited to the described order or elements unless stated to that effect. In addition, use of the term "means" in any claim is intended to invoke 35 U.S.C. §112, 6, and any claim without the word "means" is not so intended.

We claim:

1. A single-package sensing apparatus comprising:
   a first portion of semiconductor circuitry formed on a first chip and a second portion of the semiconductor circuitry formed on a second chip; and
   a magneto-resistive sensor formed over the first portion of the semiconductor circuitry formed on the first chip.

2. The sensing apparatus of claim 1, wherein the first and second chips are electrically connected together.

3. The sensing apparatus of claim 1, further comprising at least one connection pathway for connecting the first portion of the semiconductor circuitry with the magneto-resistive sensor.

4. The sensing apparatus of claim 1, further comprising a dielectric disposed between the first portion of the semiconductor circuitry and the magneto-resistive sensor.

5. The sensing apparatus of claim 4, wherein the dielectric is disposed on contact glass.

6. The sensing apparatus of claim 5, wherein the contact glass comprises a material selected from the group consisting of silicon-nitride (Si3N4), borophosilicate glass (BPSG), and silicon-oxide (SiO2).

7. The sensing apparatus of claim 1, wherein the first and second portion of the semiconductor circuitry comprises any electronic device formed from Complementary-Metal-Oxide-Semiconductor(CMOS), bipolar, Gallium-Arsenide, Germanium, bipolarCMOS (BiCMOS), Indium Phosphide (InP), and Silicon-On-Insulator (SOI) technologies.

8. The sensing apparatus of claim 1, wherein the first and second portion of the semiconductor circuitry comprises any of a resistor, capacitor, inductor, switch, pressure sensor, accelerometer, amplifier, and diode.

9. The sensing apparatus of claim 1, wherein the first and second portion of the semiconductor circuitry comprises any of functional adjust, signal conditioning, and electro-static-discharge protection circuitry.

10. The sensing apparatus of claim 1, wherein the magneto-resistive sensor comprises a sensor selected from the group consisting of an anisotropic-magneto sensor, a giant-magneto sensor, and a colossal-magneto sensor.

11. The sensing apparatus of claim 1, wherein the first portion of the semiconductor circuitry is physically separate from the magneto-resistive sensor to prevent undesired interaction between the first portion of the semiconductor circuitry and magneto-resistive sensor.

12. The sensing apparatus of claim 1, further comprising a shield disposed between the first portion of the semiconductor circuitry and the magneto-resistive sensor.

13. The sensing apparatus of claim 12, wherein the shield comprises a material selected from the group consisting of metal and magnetic materials.

14. A single-package sensing apparatus comprising:
semiconductor circuitry formed on a single chip;
a dielectric formed on the semiconductor circuitry;
a magneto-resistive sensor formed over the dielectric; and
a shield disposed in the dielectric.

* * * * *